United States Patent [19]
Iacovangelo et al.

[11] Patent Number: 5,328,715
[45] Date of Patent: Jul. 12, 1994

[54] PROCESS FOR MAKING METALLIZED VIAS IN DIAMOND SUBSTRATES

[75] Inventors: Charles D. Iacovangelo, Schenectady; Elihu C. Jerabek, Glenmont; Ronald H. Wilson, Schenectady; Peter C. Schaefer, Saratoga Springs, all of N.Y.

[73] Assignee: General Electric Company, Schenectady, N.Y.

[21] Appl. No.: 16,367

[22] Filed: Feb. 11, 1993

[51] Int. Cl.[5] ............................................. B05D 5/12
[52] U.S. Cl. .................................... 427/97; 427/123; 427/250; 427/255.1; 156/643; 156/644
[58] Field of Search .............. 427/123, 97, 250, 255.1; 156/643, 694

[56] References Cited

U.S. PATENT DOCUMENTS

| | | | |
|---|---|---|---|
| 4,741,928 | 5/1988 | Wilson et al. | 427/253 |
| 5,239,746 | 8/1993 | Goldman | 427/97 |

OTHER PUBLICATIONS

Eden, "Applicability of Diamond Substrates to Multi-Chip Modules", *ISHM '91 Proceedings*.
Das et al., "A Review of the Electrical Characteristics of Metal Contacts on Diamond", *Thin Solid Films, 212*, 19-24 (1992).
Roser et al., "High Temperature Reliability of Refractory Metal Ohmic Contacts to Diamond", *J. Electrochem. Soc., 139* (1992).
Malshe et al., "Excimer Laser-Induced Etching of Non-Hydrogenated (a-C) and Hydrogenated (a-C:H) Diamond-Like Carbon Films: A Comparative Study", *Materials Letters, 11*, 175-179 (1991).
Hewett et al., "Issues in Diamond Device Fabrication", *Diamond and Related Materials, 1*, 688-691 (1992).
Wilson and Stoll, "Highly Selective, High Rate Tungsten Deposition Using 'Hot Plate' Wafer Heating", *Tungsten and Other Refractory Metals for VLSI III*, V. A. Wells Ed, Materials Res. Soc. (1988).
Bögli et al., "Smoothening of Diamond Films With An ArF Laser", *Diamond and Related Materials, 1*, 782-788 (1992).

Primary Examiner—Shrive Beck
Assistant Examiner—David M. Maiorana
Attorney, Agent, or Firm—William H. Pittman

[57] ABSTRACT

A process for making metallized vias in diamond substrates is disclosed. The process involves laser-drilling a plurality of holes in a CVD diamond substrate and depositing tungsten, or a similar refractory metal, in the holes by low pressure CVD to provide substantially void-free metallized vias. Diamond substrates having metallized vias are also disclosed. The structures are useful for making multichip modules for high clock rate computers.

11 Claims, 1 Drawing Sheet

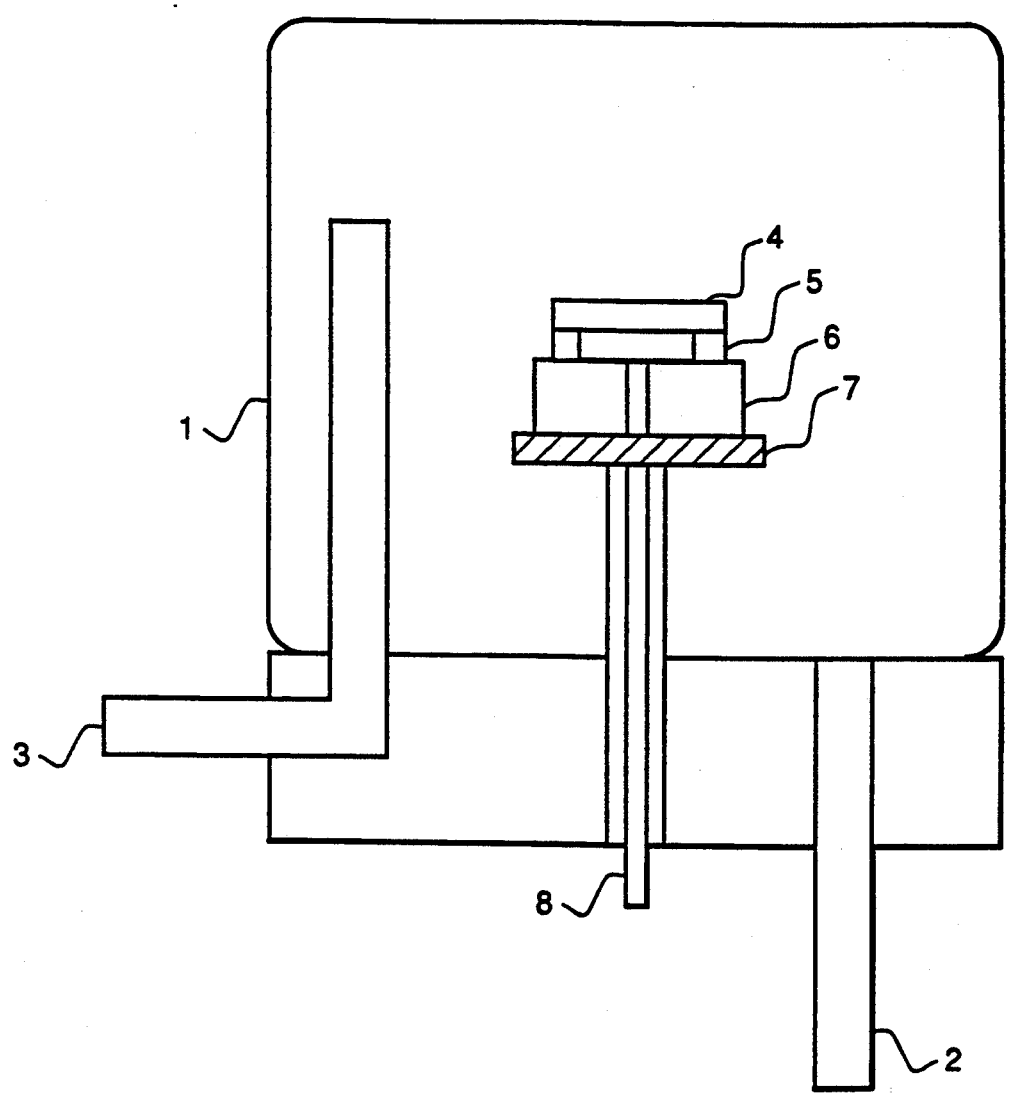

PROCESS FOR MAKING METALLIZED VIAS IN DIAMOND SUBSTRATES

FIELD OF THE INVENTION

The invention relates to a process for making metallized vias in diamond substrates and to diamond substrates having metallized vias. The metallized diamond substrates are useful in making multi-chip modules for high clock rate computers.

BACKGROUND OF THE INVENTION

The multi-chip module (MCM) approach for achieving very high densities is of particular interest for high performance, high clock rate digital systems, where signal latency due to interchip interconnect line lengths can prove a major limitation. The increasing speeds of digital integrated circuits can only be realized in increased system speeds if the signal interconnect delays can be correspondingly reduced. Such a reduction of signal propagation delays is achieved principally through the reduction in signal line lengths, such as through dense packaging of bare dies in multi-chip modules. However, due to the substantial areas of IC dies (typically 1 cm. on a side) the interconnect distances between dies in a 2-dimensional (2-D) array can be very substantial when the number of dies is large.

Three-dimensional MCM packaging permits very high density packaging. The advantage of a 3-D array is dramatic: whereas a given die has only 8 nearest neighbors in 2-D, in 3-D (assuming a 1.5 cm. X-Y pitch and a 2.5 mm. Z pitch) 116 dies may be reached with essentially the same signal interconnect length. If these 117 chips had to be spread out horizontally, the delay between chips would represent a significant performance compromise for system clock rates in the 50–100 MHz range, and would virtually preclude operation at rates above 250 MHz. With 3-D packaging, rates of nearly 1 GHz are theoretically possible.

The problem of 3-D architecture is that as IC chips are operated at higher frequencies, their power dissipations tend to increase proportionally. As the chips are packed closely in MCM packaging, the power density levels give rise to severe problems with waste heat.

Eden, in *Proceedings of the International Symposium on Hybrid Microelectronics* (1991), has pointed out that the key problem in 3-D packaging is achieving the vertical interconnects between boards with high density in a practical, demountable, reworkable fashion, while at the same time getting out of the "cube" (the completed 3-D interconnected system) the heat resulting from the substantial power dissipation from all of the high speed IC's operating in a small volume. If the problems could be solved, a 10 cm. by 10 cm. cube computer could provide all the logic of a 16-processor Cray3 ™ supercomputer. Diamond substrates with metallized vias show promise of providing the solution.

Table I shows the thermal conductivities of some materials that, on the basis of their mechanical properties, could be considered as possible substrates for mounting dies.

TABLE I

| Material | Thermal Conductivity, W/m-°C. |
|---|---|
| Diamond: | |
| Natural | 2000 |
| CVD | 500–1600 |
| Beryllia, BeO | 223 |
| AlN | 70–230 |
| Alumina, 99% | 29 |
| GaAs | 45 |
| Silicon | 149 |
| Kovar ® (FeNiCo) | 17 |
| Molybdenum | 146 |
| Aluminum | 237 |
| Copper | 396 |
| Silver | 428 |
| Diamond-Epoxy | 8.7 |
| Silver-Epoxy | 5.8 |
| Polyimide | 0.2 |

There are no electrical insulators that come within a factor of eight of diamond's thermal conductivity, which is more than four times that of copper. Natural diamond is too expensive at present to be commercially useful, but chemical vapor deposited (CVD) diamond is becoming commercially viable.

The ability to produce high density packing of active and passive components on diamond substrates is greatly limited, however, if there is no technique to pattern and interconnect traces on both sides of the diamond. In other ceramic substrates such as alumina this can be easily accomplished by co-firing the ceramics with metal traces. With CVD diamond this cannot be done because diamond does not sinter at any reasonable temperatures. Thus a technique to fabricate metallized vias in CVD diamond is needed. Ideally the vias would have a high electrical conductivity, the metal would completely fill the hole so that packaging could be hermetically sealed and the metal would adhere well to the diamond.

The present invention provides diamond substrates having tightly adherent metal vias. Said vias are, for the most part, essentially free of voids and flush with the two faces of the diamond.

SUMMARY OF THE INVENTION

In one of its aspects, the invention is a process for creating a metallized aperture in a diamond substrate comprising the steps of (a) providing a diamond substrate having one or more apertures, the surface of said diamond within the apertures being substantially free of contaminants; and (b) filling the apertures by low pressure chemical vapor deposition with a refractory metal selected from the group consisting of tungsten, niobium, molybdenum, chromium, titanium, vanadium and tantalum.

In a preferred embodiment for the purposes of making MCMs the apertures are vias extending between two surfaces of the diamond substrate, but other embodiments for other purposes might not require that the aperture extend all the way through the substrate. A preferred metal is tungsten, which may be deposited at about 300°–900° C.

In another embodiment the vias are 100–500 $\mu$m long and have an aspect ratio (diameter to length) in the range of about 1–20, in which case the tungsten is deposited at 0.1–3.0 torr.

In another way of viewing this aspect, the invention relates to a process for creating a metallized via in a diamond substrate comprising the steps of
(a) providing a diamond substrate from 100 to 500 μm thick having one or-more vias, the surface of said diamond within the vias being substantially pure diamond; and
(b) filling the vias with tungsten by low pressure chemical vapor deposition at 300°-900° C. and 0.1-3.0 torr.

Preferably, the low pressure chemical vapor deposition uses a mixture of $WF_6$ and $H_2$ as the source of tungsten.

In another way of viewing this aspect, the invention relates to a process for creating a metallized via in a diamond substrate comprising the steps of:
(a) laser ablating an aperture extending between two faces of the diamond substrate;
(b) removing residual graphite and impurities from the surface of the diamond substrate within the aperture; and
(c) depositing tungsten in the aperture by low pressure chemical vapor deposition at 300°-900° C. and 0.1-3.0 torr.

In preferred embodiments, the aperture is narrower at a point midway between the two faces than at either face and the aperture has an aspect in the range of about 1-20.

In another aspect the invention relates to a diamond substrate for an integrated circuit chip comprising a substantially planar sheet of diamond having two major faces and at least one substantially void-free metallized via extending through the sheet to provide a pathway of a metal from one face to the other. The metal is selected from the group consisting of tungsten, niobium, molybdenum, chromium, titanium, vanadium and tantalum; preferably it is tungsten. The tungsten exhibits a pull strength adhesion to the diamond greater than 70 kg./cm.$^2$ and has a resistivity less than $10^{-5}$ ohm-centimeters. In one embodiment the diamond sheet is 100-500 μm thick and the metallized via is 5-200 μm in diameter.

In another aspect the invention relates to a multichip package comprising:
(a) a housing; and
(b) at least one diamond substrate as described above.

BRIEF DESCRIPTION OF THE DRAWING

The drawing is a schematic representation of an apparatus for carrying out the process of the invention.

DETAILED DESCRIPTION OF THE INVENTION

As discussed above, diamond is an ideal MCM substrate. It is as good an electrical insulator as alumina and it has four times the thermal conductivity of copper. In addition it has better dielectric properties than alumina and very fine traces can be created on diamond substrates. For the most part there has been little research on single crystal diamond or high pressure diamond because they are too expensive. Now that diamond is being made by CVD, the price is coming down to a level that is feasible for microelectronics.

For many applications, it is desirable to have an electrical contact path from the front to the back of a sheet of diamond. There may be 4 or 5 isolated chips on a diamond sheet. These may be gallium arsenide, indium phosphide or silicon chips. The chips would be interconnected vertically (from diamond sheet to diamond sheet) by creating vias through the diamond substrate and then putting, for example, a resilient solder ball between the aligned metallized vias. The problem then devolves to one of creating useable metallized vias in diamond.

The ablation of holes in CVD diamond by ArF or KrF excimer lasers is known; see Malshe et al., *Materials Letters*, 11, 175-179 (1991). It has also been found that patterned 5 to 50 μm vias can be drilled in 200 to 250 μm thick diamond by ablation with a YAG laser. These holes can be straight-walled or somewhat tapered from each side so that the narrowest dimension (smallest diameter) is roughly in the center of the hole. Tapered holes may slightly increase the maximum practical deposition rate by decreasing the likelihood of pinching off.

The holes could, in principle, be metallized with any refractory metal. In practice, a number of factors influence the choice: (1) the metal should provide a highly conductive pathway; (2) the metal should adhere well to diamond and (3) the metal should be able to be deposited by a process that can fill very small holes having high aspect ratios. For purposes of high conductivity, aluminum, copper, gold, palladium, platinum, nickel, niobium, tantalum, tungsten, molybdenum, chromium, vanadium, zirconium and titanium, as well as silver, gold and tin alloys, could be considered. Not all of these, however, are well suited.

Adherence to diamond can take place by the formation of a carbide at the interface of the metal and the diamond, so metals that form carbides are preferred. But, to maintain adherence, the metal should have a coefficient of thermal expansion (CTE) which is not too different from that of the diamond substrate. Tungsten, molybdenum, niobium, chromium, vanadium and tantalum are therefore preferred.

Metals that are best deposited by electroplating or sputtering are not well suited to metallizing the vias because they will not create essentially void-free deposits in holes with high aspect ratios. Voids in the metallization lead to increased electrical resistance and to difficulties in hermetically sealing the packages. Metals that can be deposited by low-pressure CVD (LPCVD) are preferred. It has been found that LPCVD tungsten has the best electrical conductivity of the LPCVD metals.

Balancing all of the competing requirements, tungsten appears to be the optimal metal, although niobium, molybdenum, chromium, titanium, vanadium and tantalum are also possible.

The tungsten is deposited by low pressure chemical vapor deposition (LPCVD), as described in Wilson and Stoll, *Tungsten and Other Refractory Metals for VLSI*; V. A. Wells Materials Research Society, Pittsburgh, Pa. (1988), pages 311 to 316, which is incorporated herein by reference. Several parameters appear important in the production of void-free deposits: (1) the temperature of the deposition; (2) the pressure in the LPCVD chamber and (3) the source of tungsten. When tungsten is deposited from $WF_6$ and $H_2$ the ratio of $WF_6$ to $H_2$ must be controlled so that the HF, which is a by-product of the reaction, does not become trapped in the tungsten as it is being deposited. In addition, it is usually desired that the rate of deposition be as rapid as possible without "pinching off" the center of the deposition. This will be a function of aspect ratio and hole size. Finally the temperature of deposition appears to play a role in adhesion, perhaps because of the formation of tungsten carbide at the interface. For filling a 50 μm hole in a 200 μm CVD diamond it has been found that about 12:1 H₂ to WF₆ at 0.5 to 1.0 torr and 450°-750° C. is optimal. These conditions will probably be fairly close to optimal for most tungsten depositions.

It has also been found that a clean diamond surface is critical for good adhesion. To this end it is important to remove traces of graphite and other contaminants from the holes after laser ablation and before metallization. Four hour exposure to a 4:1 mixture of boiling sulfuric and nitric acids followed by rinsing and drying appears to clean the diamond well; other mixtures such as hot $CrO_3$ in sulfuric acid may also suffice.

Tungsten can be LPCVD deposited to slightly overfill the holes. When the surface is planarized, for example by conventional chemical-mechanical polishing, the vias will be sufficiently flush that surface metallization can be patterned by photolithography without distortion around the vias.

It has been found that tungsten deposited at or below about 450° C. adheres poorly to diamond; heating the via above 900° C. appears to weaken the adhesion under most circumstances, although it may be possible to heat above 900° C. in the absence of hydrogen. In this respect, molybdenum might be a reasonable alternative to tungsten. It can be deposited analogously by LPCVD from $MoF_6$ and, if the volume expansion of W→WC is the reason for high temperature loss of adhesion, the lower volume expansion of Mo→$Mo_2C$ might prove advantageous, although the CTE match is not quite as good between Mo and diamond as between W and diamond.

In a series of experiments CVD diamond sheets about 200 μm thick were patterned with a series of 50 μm holes using a YAG laser from Control Laser. The diamond was cleaned for 4 hours in boiling 4:1 sulfuric acid:nitric acid, rinsed in deionized water, methanol, and 2-propanol and blown dry. The CVD diamond with the laser-ablated holes was placed on top of two diamond substrates to suspend the part above the base of the LPCVD reactor. The substrates were also used for tungsten adhesion tests and thickness measurements. The LPCVD-W was deposited by the hydrogen reduction of tungsten hexafluoride at a $H_2/WF_6$ volume to volume ratio of 12:1.

Two different LPCVD-W reactors were used to coat CVD diamond. Table II shows results in a conventional hot walled tube reactor where the temperature was controlled by an external tube furnace and the pressure was maintained at 1 torr. $WF_6$ and $H_2$ were fed into the system at 125 and 1500 SCCM, respectively. In this case, W was deposited both on the CVD diamond and the walls of the reactor and holders. This is probably not the optimal apparatus because a lot of tungsten is wasted by deposition on surfaces of the apparatus. Glass supports were used to hold the CVD diamond samples. Temperature was monitored with a thermocouple placed inside the tube with the end near the diamond samples. The temperature shown in the tables is the temperature at the thermocouple, not at the substrate. By interpolation from a curve of deposition rate vs. temperature, one can calculate that the actual temperature of the substrate is about 50°-70° C. lower.

TABLE II

| # | Temp., °C. | Time, hrs. | Thickness, μm | Adhesion, Kg/cm² | Resistivity, μohm-cm |
|---|---|---|---|---|---|
| 1 | 400 | 0.05 | | 3.5 | |
| 2 | 440 | 0.05 | 0.26 | 3.5 | 9.8 |
| 3 | 500 | 0.05 | 0.26 | 7.0 | |
| 4 | 550 | 0.05 | 0.24 | 96 | |
| 5 | 550 | 0.05 | 0.24 | | |
| 6 | 550 | 0.05 | 0.25 | | |
| 7 | 550 | 0.05 | 0.33 | 457 | 5.94 |
| 8 | 550 | 0.025 | 0.28 | | 9.7 (glass) |
| 9 | 550 | 0.025 | 0.28 | | 8.1 |
| 10 | 550 | 1 | 16.4 | | 8.2 |
| 11 | 550 | 0.025 | 0.21 | >351 | |
| 12 | 550 | 1 | 10.0 | | |
| 13 | 550 | 1 | 12.0 | 211 | |
| 14 | 550 | 1 | 12.0 | 302 | |

The second reactor, shown in the drawing, comprises a bell jar 1 which has a tube 2 for evacuating the system by means of a vacuum pump (not shown). The source gases, in this case $WF_6$ and $H_2$, are led into the jar through inlet tube 3. The CVD diamond substrate 4 rests on supports 5 above a graphite pedestal 6. The pedestal is heated by an RF heating coil 7 and the temperature of the pedestal is monitored through thermocouple 8.

A graphite RF induction heated stage was used to hold the CVD diamond so that W deposition took place only on the diamond and graphite. The results are shown in Table III.

TABLE III

| # | $H_2/WF_6$, SCCM | Temp., °C. | Time, hrs. | Pressure, torr | Thickness, μM | Resistivity, μohm-cm |
|---|---|---|---|---|---|---|
| 16 | 1500/125 | 600 | 1 | 2.4 | 20.8 | 5.8 |
| 17 | 1500/125 | 575 | 1 | 2.4 | 20.0 | |
| 18 | 1500/125 | 550 | 1 | 2.4 | 21.0 | |
| 19 | 1500/125 | 500 | 1 | 2.2 | 17.5 | |
| 20 | 750/62 | 500 | 1 | 1.0 | 10.0 | |
| 21 | 750/62 | 550 | 1 | 1.0 | 14.4 | |
| 22 | 380/32 | 550 | 2 | 0.5 | 14.3 | |
| 23 | 380/32 | 550 | 2 | 0.5 | 14.3 | 5.6 |

It appears that from Tables II and III that 1 torr is optimal in the tube reactor and 0.5 torr in the bell jar. Samples 10, 12, 13, 14, 20, 21, 22 and 23 had vias; the remainder were flat sheets used to examine adhesion, thickness, and conductivity of the LPCVD-W deposit. In the cases where the diamond contained vias, the diamond sheet was supported above the graphite or glass support with two pieces of CVD diamond that contained lips. The height of the diamond sheet off the support was typically 0.2 cm. The only exceptions were experiments 14 and 15, in which cases the diamond sheet with vias was placed on an open screen to allow gas flow through the holes. In all cases, the gas flow was parallel to the surface of the sheet, i.e. flow was by, not through, the holes.

In the case of examples 20 and 21, the vias were not completely filled. In the other cases (i.e. 10, 12, 13, 14, 22 and 23), examination under back-lighting and electrical resistance measurement indicated substantially void-free deposition in the vias.

Adhesion was measured using a Sebastian Model 1 Adhesion Tester ™. Epoxy coated studs were held against the CVD diamond metallization using spring loaded clips with a slot machined for the stud. The assembly was heated in air at 150° C. to cure the epoxy.

The epoxy has a tensile strength of ~702 kg./cm² which sets the limit of the test. After curing the epoxy, the stud was lowered into the Sebastian pull tester which recorded the force applied to the stud up to the final force when the stud detached from the sample. The stud and substrate were then examined visually to determine where the separation occurred (e.g., metallization/CVDD, epoxy/metallization). The pull pattern was also examined for complete wetting of the epoxy. If it appeared that the total area was not wetted, the force was corrected for the actual area.

What is claimed is:

1. A process for creating a metallized aperture in a diamond substrate comprising the steps of
    (a) providing a diamond substrate having one or more apertures, the surface of said diamond within said apertures being substantially free of contaminants;
    b) filling said apertures by low pressure chemical vapor deposition with tungsten.

2. A process according to claim 1 wherein said apertures are vias extending between two surfaces of said diamond substrate.

3. A process according to claim 2 wherein said tungsten is deposited at about 300°–900° C.

4. A process according to claim 3 wherein said vias are 100–500 μm long and have an aspect ratio in the range of about 1–20 and wherein said tungsten is deposited at 0.1–3.0 torr.

5. A process for creating a metallized via in diamond substrate comprising the steps of:
    (a) providing a diamond substrate 100–500 μm thick having one or more vias, the surface of said diamond within said vias being substantially pure diamond;
    b) filling said vias with tungsten by low pressure chemical vapor deposition at 450°–750° C.

6. A process according to claim 5 wherein said low pressure chemical vapor deposition uses a mixture of $WF_6$ and $H_2$ as the source of tungsten.

7. A process according to claim 5 wherein the pressure during chemical vapor deposition is 0.1–3.0 torr.

8. A process for creating a metallized via in a diamond substrate comprising the steps of:
    (a) laser etching an aperture extending between two faces of said diamond substrate;
    (b) removing residual graphite and impurities from the surface of said diamond substrate within said aperture; and
    (c) depositing tungsten in said aperture by chemical vapor deposition at 450°–650° C.

9. A process according to claim 8 wherein said aperture is narrower at a point midway between said two faces than at either face.

10. A process according to claim 8 wherein said aperture has an aspect ratio in the range of about 1–20.

11. A process according to claim 8 wherein the pressure during chemical vapor deposition is 0.1–3.0 torr.

* * * * *